US010720941B2

(12) United States Patent
Sofia et al.

(10) Patent No.: US 10,720,941 B2
(45) Date of Patent: Jul. 21, 2020

(54) COMPUTER SYSTEM SUPPORTING MIGRATION BETWEEN HARDWARE ACCELERATORS THROUGH SOFTWARE INTERFACES

(71) Applicant: INTERNATIONAL BUSINESS MACHINES CORPORATION, Armonk, NY (US)

(72) Inventors: Anthony T. Sofia, Hopewell-Junction, NY (US); Jonathan D. Bradbury, Poughkeepsie, NY (US); Matthias Klein, Wappingers Falls, NY (US); Peter Sutton, Lagrageville, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/948,659

(22) Filed: Apr. 9, 2018

(65) Prior Publication Data
US 2019/0312590 A1    Oct. 10, 2019

(51) Int. Cl.
*G06F 9/44* (2018.01)
*H03M 7/30* (2006.01)
*G06F 8/61* (2018.01)
*G06F 8/65* (2018.01)
*H03M 7/40* (2006.01)

(52) U.S. Cl.
CPC ............. *H03M 7/6011* (2013.01); *G06F 8/61* (2013.01); *G06F 8/65* (2013.01); *H03M 7/3086* (2013.01); *H03M 7/40* (2013.01)

(58) Field of Classification Search
CPC .................................................. G06F 16/1744
See application file for complete search history.

(56) References Cited

U.S. PATENT DOCUMENTS

| 6,449,689 B1 | 9/2002 | Corcoran et al. |
| 6,661,839 B1 | 12/2003 | Ishida et al. |
| 7,376,772 B2 | 5/2008 | Fallon |
| 7,624,394 B1 | 11/2009 | Christopher, Jr. |
| 7,640,381 B1 | 12/2009 | Zhang et al. |

(Continued)

FOREIGN PATENT DOCUMENTS

EP    2246786 A1    11/2010

OTHER PUBLICATIONS

Anthony T. Sofia et al., "Multi-Mode Compression Acceleration", U.S. Appl. No. 15/948,678, filed Apr. 9, 2018.
(Continued)

*Primary Examiner* — Chat C Do
*Assistant Examiner* — Lenin Paulino
(74) *Attorney, Agent, or Firm* — Cantor Colburn LLP; Teddi Maranzano

(57) ABSTRACT

A computer system includes a hardware controller and a host system. The hardware controller includes an accelerator to encode a data stream requested by an application based on a version of the accelerator. The host system executes a compression library linked to the application. The compression library operates according to one or more behavior characteristics to execute a compression algorithm that compresses the encoded data provided by the hardware controller. The behavior characteristics of the compression library is actively changed based on the version of the accelerator.

14 Claims, 6 Drawing Sheets

(56) References Cited

U.S. PATENT DOCUMENTS

| | | | |
|---|---|---|---|
| 7,765,521 | B2 | 7/2010 | Bryant |
| 7,890,727 | B2 | 2/2011 | Mathews et al. |
| 8,108,353 | B2 | 1/2012 | Balachandran et al. |
| 8,250,578 | B2 | 8/2012 | Krishnamurthy et al. |
| 8,275,909 | B1 | 9/2012 | Rothstein |
| 8,312,210 | B2 | 11/2012 | Benhase et al. |
| 8,359,186 | B2 | 1/2013 | Sanesan et al. |
| 8,553,759 | B2 | 10/2013 | Fallon et al. |
| 8,610,604 | B2 | 12/2013 | Glass et al. |
| 8,712,978 | B1 | 4/2014 | Shilane et al. |
| 8,943,024 | B1 | 1/2015 | Gardner et al. |
| 9,385,749 | B1 | 7/2016 | Nam et al. |
| 9,442,754 | B1 | 9/2016 | Tsirkin |
| 9,514,146 | B1 | 12/2016 | Wallace et al. |
| 9,621,186 | B2 | 4/2017 | Nam et al. |
| 9,716,754 | B2 | 7/2017 | Swift |
| 9,733,854 | B2 | 8/2017 | Sharma et al. |
| 9,811,319 | B2 | 11/2017 | Weinsberg et al. |
| 9,929,748 | B1 | 3/2018 | Gopal et al. |
| 10,019,457 | B1 | 7/2018 | Stefani et al. |
| 10,374,629 | B1 | 8/2019 | Bradbury et al. |
| 2002/0101367 | A1 | 8/2002 | Geiger et al. |
| 2006/0212462 | A1 | 9/2006 | Heller et al. |
| 2009/0307711 | A1 | 12/2009 | Krishnamurthy et al. |
| 2010/0321218 | A1 | 12/2010 | Koratagere |
| 2011/0138270 | A1 | 6/2011 | Li et al. |
| 2011/0307907 | A1* | 12/2011 | Hwang ............... G06F 3/1204 719/327 |
| 2013/0135122 | A1* | 5/2013 | Glass ............... H03M 7/6076 341/65 |
| 2013/0135123 | A1 | 5/2013 | Golander et al. |
| 2013/0268497 | A1 | 10/2013 | Baldwin et al. |
| 2013/0307709 | A1 | 11/2013 | Miller et al. |
| 2014/0086309 | A1 | 3/2014 | Beer-Gingold et al. |
| 2014/0351229 | A1 | 11/2014 | Gupta |
| 2014/0351811 | A1* | 11/2014 | Kruglick ............. G06F 9/45558 718/1 |
| 2015/0066878 | A1 | 3/2015 | Agarwal et al. |
| 2016/0173123 | A1* | 6/2016 | Gopal ............... H03M 7/40 341/65 |
| 2017/0132241 | A1* | 5/2017 | Haverkamp ........ G06F 16/1744 |
| 2017/0187388 | A1 | 6/2017 | Satpathy et al. |
| 2017/0212487 | A1 | 7/2017 | Gupta et al. |
| 2017/0220404 | A1 | 8/2017 | Polar Seminario |

OTHER PUBLICATIONS

Anthony T. Sofia, "Computer System Supporting Multiple Encodings With Static Data Support", U.S. Appl. No. 15/938,000, filed Mar. 28, 2018.

Jonathan D. Bradbury et al., "Compression Hardware Including Active Compression Parameters", U.S. Appl. No. 15l972,394, filed May 7, 2018.

List of IBM Patents or Patent Applications Treated as Related; (Appendix P), Filed May 16, 2018; 2 pages.

D. Syrivelis et al., "On emulating hardware/software co-designed control algorithms for packet switches," SIMUTools '14: Proceedings of the 7th International ICST Conference on Simulation Tools and Techniques, pp. 132-141.

E. Horta et al., "Dynamic hardware plugins in an FPGA with partial run-time reconfiguration," DAC '02 Proceedings of the 39th annual Design Automation Conference, pp. 343-348.

J. Rapp et al., "Dynamically Configured Hardware Accelerator Functions," ip.com Disclosure No. IPCOM000171311D.

S. Chai et al., "Reconfigurable Streaming Architectures for Embedded Smart Cameras," ip.com Disclosure No. IPCOM000141061D.

Schroeter et al., "Dynamic configuration management of cloud-based applications," SPLC'12 Proceedings of the 16th International Software Product Line Conference—vol. 2, pp. 171-178.

Augonnet et al., "Data-Aware Task Scheduling on Multi-Accelerator Based Platforms," 2010 IEEE 16th International Conference on Parallel and Distributed Systems, pp. 291-298.

Campoalegre, Volumetric Medical Images Visualization on Mobile Devices. MS thesis. Universitat Politècnica de Catalunya, 2010.

Kachouri et al., "Hardware design to accelerate PNG encoder for binary mask compression on FPGA." SPIE 9400, Real-Time Image and Video Processing. 2015.

Lettieri et al., "Data Compression in the V. 42bis Modems." WESCON/94. Idea/Microelectronics. Conference Record. IEEE, 1994. pp. 398-403.

Mauve, "Protocol enhancement and compression for x-based application sharing." University of Mannheim (1997): 11-12.

Meng et al., "Investigating applications portability with the Uintah DAG-based runtime system on PetaScale supercomputers," SC '13 Proceedings of the International Conference on High Performance Computing, Networking, Storage and Analysis, Article No. 96.

Nikkanen, . "uClinux as an embedded solution." Diss, Turku, Salo, Finland (2003).

Planas et al., "AMA: Asynchronous management of accelerators for task-based programming models," Procedia Computer Science 51 (2015): 130-139.

Singh et al., "Enhancing LZW Algorithm to Increase Overall Performance." India Conference, 2006 Annual IEEE. IEEE, 2006. (4 pages).

Teimouri et al., "Revisiting accelerator-rich CMPs: challenges and solutions," DAC '15 Proceedings of the 52nd Annual Design Automation Conference, Article No. 84.

Anthony T. Sofia et al., "Multi-Mode Compression Acceleration", U.S. Appl. No. 16/668,061, filed Oct. 30, 2019.

List of IBM Patents or Patent Applications Treated as Related; (Appendix P), Filed Nov. 15, 2019; 2 pages.

Anthony T. Sofia, "Computer System Supporting Multiple Encodings With Static Data Support", U.S. Appl. No. 16/738,217, filed Jan. 9, 2020.

List of IBM Patents or Patent Applications Treated as Related; (Appendix P), Filed Jan. 10, 2020; 2 pages.

\* cited by examiner

US 10,720,941 B2

COMPUTER SYSTEM SUPPORTING MIGRATION BETWEEN HARDWARE ACCELERATORS THROUGH SOFTWARE INTERFACES

BACKGROUND

The present invention relates to digital computer systems, and more particularly, to digital data compression schemes employed in digital computer systems.

Digital computer systems perform data compression to realize a more efficient use of finite storage space. The computer system typically includes a hardware component referred to as a compression accelerator, which accepts work requests or data requests from the host system to compress or decompress one or more blocks of the requested data. Traditional computer applications may require that compression services use a software data compression library, typically a zlib or compatible library, which is statically linked to various software products or applications to execute a "DEFLATE" compatible compression algorithm to compress data and conserve storage space. The compression library generally provides a data stream based interface, which can be utilized by the compression accelerator to perform hardware compression/decompression on the requested data. A typical data stream interface allows an application to break up input data to be compressed/decompressed in arbitrary ways across multiple requests.

SUMMARY

According to a non-limiting embodiment, a computer system includes a hardware controller and a host system. The hardware controller includes an accelerator to encode a data stream requested by an application based on a version of the accelerator. The host system executes a compression library linked to the application. The compression library operates according to one or more behavior characteristics to execute a compression algorithm that compresses the encoded data provided by the hardware controller. The behavior characteristics of the compression library is actively changed based on the version of the accelerator.

According to another non-limiting embodiment, a method of controlling a computer system comprises encoding, via an accelerator installed in a hardware controller, a data stream requested by an application based on a version of the accelerator, and executing, via a host system, a compression library linked to the application. The method further comprises operating the compression library according to at least one behavior characteristic to execute a compression algorithm that compresses the encoded data stream provided by the hardware controller. The method further comprises detecting a change in the version of the accelerator, and changing the at least one behavior characteristic of the compression library based on the changed version of the accelerator.

According to still another non-limiting embodiment, a computer program product controls a computer system to compress data. The computer program product comprises a computer readable storage medium having program instructions embodied therewith. The program instructions are executable by an electronic computer processor to control the computer system to perform operations comprising encoding, via an accelerator installed in a hardware controller, a data stream requested by an application based on a version of the accelerator, and executing, via a host system, a compression library linked to the application. The method further comprises operating the compression library according to at least one behavior characteristic to execute a compression algorithm that compresses the encoded data stream provided by the hardware controller. The method further comprises detecting a change in the version of the accelerator, and changing the at least one behavior characteristic of the compression library based on the changed version of the accelerator.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

Figure 1:
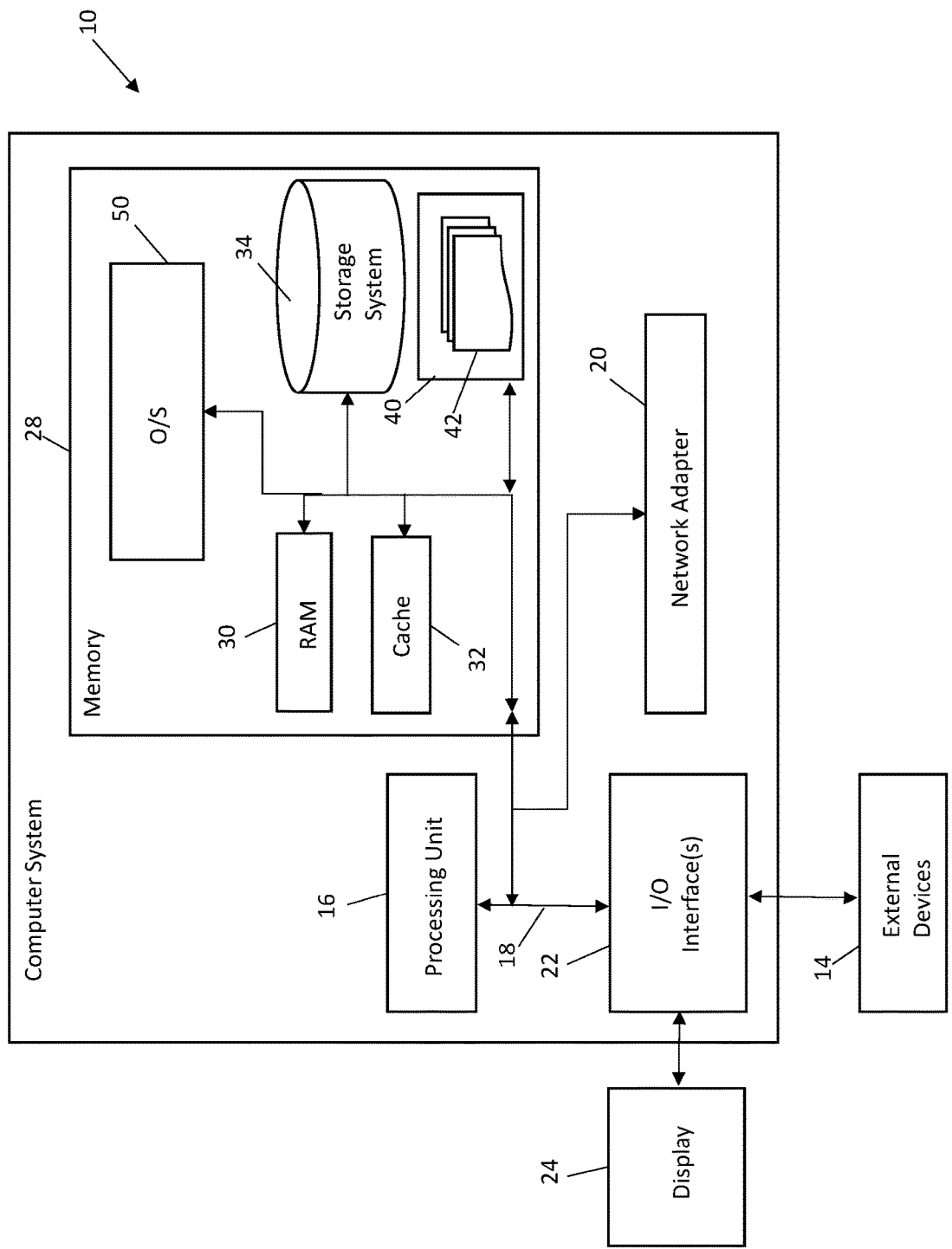
FIG. 1 is a block diagram illustrating a computer system which is capable of compressing data in accordance with various embodiments of the invention.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the disclosed embodiments, the various elements illustrated in the figures are provided with two or three digit reference numbers. With minor exceptions, the leftmost digit(s) of each reference number correspond to the figure in which its element is first illustrated.

DETAILED DESCRIPTION

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" may be understood to include any integer number greater than or equal to one, i.e., one, two, three, four, etc. The terms "a plurality" may be understood to include any integer number greater than or equal to two, i.e., two, three, four, five, etc. The term "connection" may include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

Turning now to an overview of technologies that are more specifically relevant to aspects of the invention, there are instances during operation of a digital computer system where code is linked statically to calling programs or applications. Embedded in this statically linked code are architectural parameters that are passed to an operating system (OS) of the computer system. One such case is the compression library such as, for example, the open source library zlib, which are typically statically linked to particular application or software product. The compression library works together with the OS to perform data compression and/or decompression, sometimes referred to as "deflation" and "inflation", respectively. The deflation/inflation compression schemes are typically viewed as software-based compression schemes.

The computer system also includes hardware, e.g., a compression accelerator, which performs hardware-based compression. The static compression library can be used along with the compression accelerator. However, the static compression library must "behave" in a manner that is compatible with the compression accelerator. The behavior of the compression library includes, but is not limited to, generating a request block having a particular size that can be correctly processed by the compression accelerator, including data in the request block indicating various compression size thresholds that determine whether the compression accelerator performs hardware compression or refrains from performing hardware compression, and including data in the data request block that informs the compression accelerator which encoding scheme should be used to compress a requested data or data stream called by the application or software product.

The statically linked compression libraries also utilize several allocated library control memory fields and control structures, which are provided back to the OS to facilitate data communication. The compression library is able to access these control memory fields and control structures in the OS memory to acquire library compression control data such as, for example, lengths of the compression code that are statically linked to a given application. There are also several other constants that the static compression libraries utilize, which are also sourced from the control memory fields stored in the OS memory.

As technology advances, the hardware component (e.g., the compression accelerator), the OS and/or the compression library will need to be updated and optimized. As a result, different encoding schemes, which provide compression optimization, will be implemented in the computer system than where previously used with older legacy platforms. The inevitable optimization and updating of these computing elements do not change the fact that the compression library is statically linked or embedded into software products and computer applications which expect a specific encoding to be included in the data stream. Overtime, however, the compression libraries have continued to be statically linked to new products released across a software stack. Therefore it may be difficult, if not impossible, to replace or update all instances of the compression libraries. Moreover, if a computer system is updated to operate according to new hardware-based instructions, a new and different programming interface will likely be implemented, which in turn must be managed and supported (i.e., compatible) by all existing compression libraries statically linked to their application or software products.

As described herein, one or more embodiments address the above-described shortcomings of the prior art by providing a digital computer system that is capable of selecting among different device drivers based on the current version of the hardware (e.g., the hardware accelerator). One or more embodiments also provide an initialization procedure, which loads the fixed data fields of the OS memory with different compression library control values depending on the current version of the compression accelerator. When the computer system is initialized, the compression library control values utilized by the static compression library are also updated. The compression library then accesses its allocated data fields from the OS to correctly identify the compression values required to operate with a new or updated compression accelerator.

With reference now to FIG. 1, a computer system 10 is illustrated in accordance with a non-limiting embodiment of the present disclosure. The computer system 10 may be based on the z/Architecture, for example, offered by International Business Machines Corporation (IBM). The architecture, however, is only one example of the computer system 10 and is not intended to suggest any limitation as to the scope of use or functionality of embodiments described herein. Regardless, computer system 10 is capable of being implemented and/or performing any of the functionality set forth hereinabove.

Computer system 10 is operational with numerous other general purpose or special purpose computing system environments or configurations. Examples of well-known computing systems, environments, and/or configurations that may be suitable for use with computer system 10 include, but are not limited to, personal computer systems, server computer systems, thin clients, thick clients, cellular telephones, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system 10 may be described in the general context of computer system-executable instructions, such as program modules, being executed by the computer system 10. Generally, program modules may include routines, programs, objects, components, logic, data structures, and so on that perform particular tasks or implement particular abstract data types. Computer system 10 may be practiced in distributed cloud computing environments where tasks are performed by remote processing devices that are linked through a communications network. In a distributed computing environment, program modules may be located in both local and remote computer system storage media including memory storage devices.

As shown in FIG. 1, computer system 10 is shown in the form of a general-purpose computing device, also referred to as a processing device. The components of computer system 10 may include, but are not limited to, one or more processors or processing units 16, a system memory 28, and a bus 18 that couples various system components including system memory 28 to processor 16.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Computer system 10 may include a variety of computer system readable media. Such media may be any available media that is accessible by computer system/server 10, and it includes both volatile and non-volatile media, removable and non-removable media.

System memory 28 can include an operating system (OS) 50, along with computer system readable media in the form of volatile memory, such as random access memory (RAM) 30 and/or cache memory 32. Computer system 10 may further include other removable/non-removable, volatile/non-volatile computer system storage media. By way of example only, storage system 34 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 18 by one or more data media interfaces. As will be further depicted and described below, memory 28 may include at least one program product having a set (e.g., at least one) of program modules that are configured to carry out the functions of embodiments of the disclosure.

The OS 50 controls the execution of other computer programs and provides scheduling, input-output control, file and data management, memory management, and communication control and related services. The OS 50 can also include a library API (not shown in FIG. 1). The library API is a software library comprising APIs for performing the data manipulation functions provided by the specialized hardware devices such as, for example, a compression accelerator (not shown in FIG. 1).

The storage system 34 can store a basic input output system (BIOS). The BIOS is a set of essential routines that initialize and test hardware at startup, start execution of the OS 50, and support the transfer of data among the hardware devices. When the computer system 10 is in operation, the processor 16 is configured to execute instructions stored within the storage system 34, to communicate data to and from the memory 28, and to generally control operations of the computer system 10 pursuant to the instructions Program/utility 40, having a set (at least one) of program modules 42, may be stored in memory 28 by way of example, and not limitation, as well as the OS 50, one or more application programs, other program modules, and program data. Each of the operating system, one or more application programs, other program modules, and program data or some combination thereof, may include an implementation of a networking environment. Program modules 42 generally carry out the functions and/or methodologies of embodiments of the invention as described herein.

Computer system 10 may also communicate with one or more external devices 14 such as a keyboard, a pointing device, a display 24, etc.; one or more devices that enable a user to interact with computer system/server 10; and/or any devices (e.g., network card, modem, etc.) that enable computer system/server 10 to communicate with one or more other computing devices. Such communication can occur via Input/Output (I/O) interfaces 22. Still yet, computer system 10 can communicate with one or more networks such as a local area network (LAN), a general wide area network (WAN), and/or a public network (e.g., the Internet) via network adapter 20. As depicted, network adapter 20 communicates with the other components of computer system 10 via bus 18. It should be understood that although not shown, other hardware and/or software components could be used in conjunction with computer system 10. Examples include, but are not limited to: microcode, device drivers, redundant processing units, external disk drive arrays, RAID systems, tape drives, data archival storage systems, etc.

Figure 2:
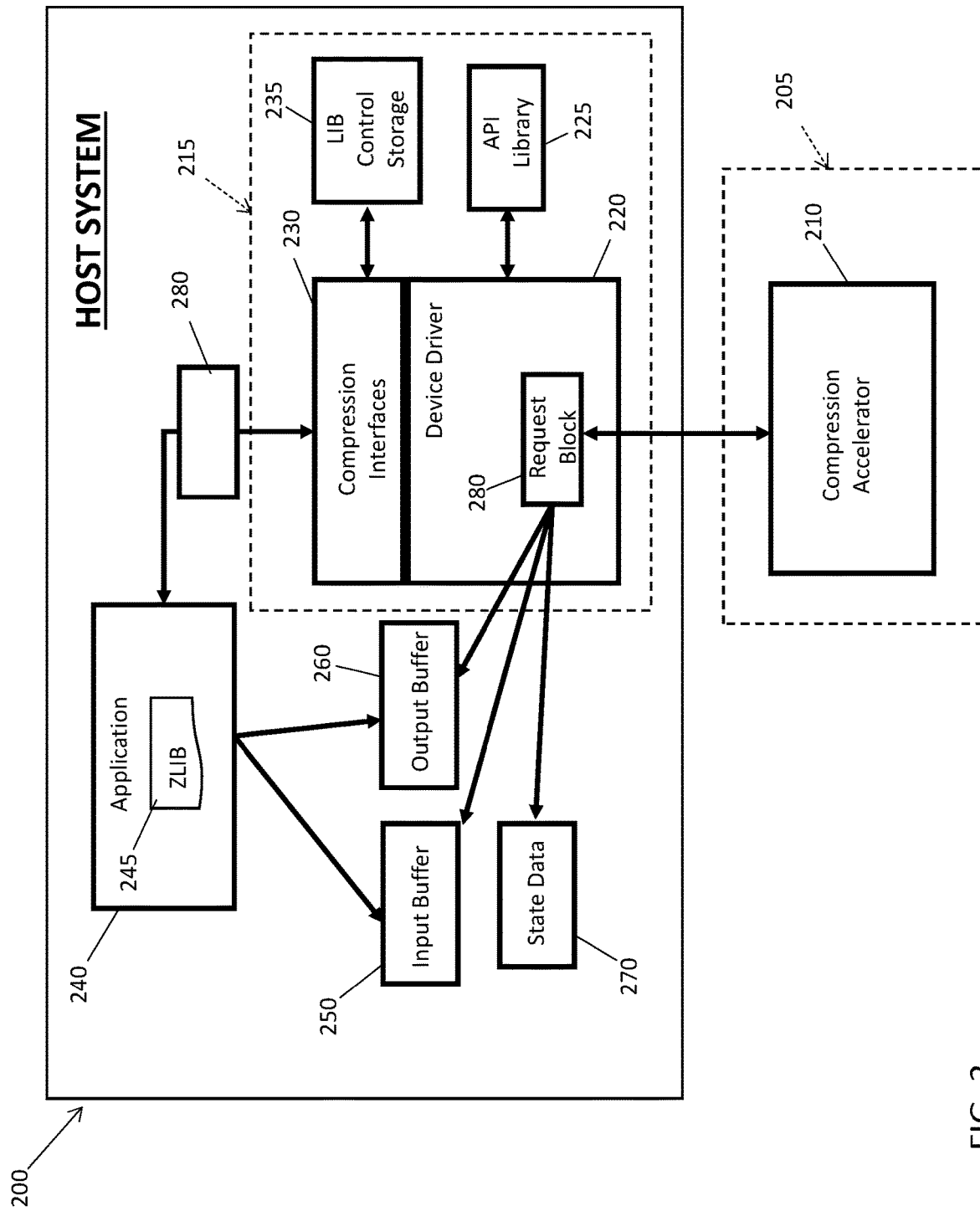
FIG. 2 is a block diagram of a host system in signal communication with a hardware component according to a non-limiting embodiment.

With reference to FIG. 2, a host system 200 is illustrated in signal communication with one or more computing hardware components 205 according to a non-limiting embodiment. The host system 200 and the hardware component 205 can be implemented using the processing unit 16 in combination with the other components of the computer system 10 described in FIG. 1.

The hardware component 205 includes, but is not limited to, an electronic hardware controller installed with a compression accelerator 210. According to a non-limiting embodiment, the compression accelerator 210 can be shared among multiple host systems, but for simplicity only one host system 200 is shown in FIG. 2. The interaction between the compression accelerator 210 and the host system 200 can be controlled by the host system's operating system (OS) 215.

The host OS 215 includes a device driver 220 capable of providing one or more compression interfaces 230, one or more API libraries 225, and a compression library control storage unit 235. The OS 215 can also provide different compression and decompression functions including, but not limited to, a function to discover if certain compression/decompression services are available, a function to determine if a user of the current task has access to use a given compression/decompression service, and a function to obtain a given compression/decompression service from an external source.

The host system 200 is capable of running one or more applications 240 to facilitate data compression. The application 240 is installed with one or more compression libraries 245. The figures reference a "zlib" in the figures; however, the disclosure is of course not limited to any particular library. The compression library 245 is compatible with the compression interfaces 230 of the OS 215 and informs the compression accelerator 210 (e.g., via one or more parameter data blocks) of the specific encoding scheme to be used to compress the requested data or data stream.

The compression library 245 can also access the API library 225 and the compression library control storage unit 235. The API library 225 can be accessed to provide the application 240 with an API capable of calling different compression and decompression functions provided by the OS 215.

The compression library control storage unit 235 includes various memory fields that are controlled by the OS 215 but can be accessed by the compression library 245. For instance, various memory fields in the compression library control storage unit 235 may be specifically allocated to the compression library 245 for its use but can be dynamically filled by the OS 215 with data that controls the behavior of the compression library 245. The compression library 245 has instructions to read the data from these fixed memory fields and operate accordingly. Therefore, the OS 50 can control the behavior of the compression library 245 based on the data added into the fixed memory fields of the compression library control storage unit 235.

In one or more embodiments, uncompressed data is obtained by the application 240 and is passed by a pointer to the compression library 245. The compression library 245 passes the pointer to the operating system 215 for the data buffer. In turn, the operating system 215 passes the buffer data indicated by the pointer to the hardware 205, and the compression accelerator 210 performs an initial data compression on the data provided by the application 240. The initial compressed data can be stored in the output buffer 260, and then passed by a pointer between the OS 215 and the compression library 245. In the event a flush operation is performed, then the compression library 245 possesses information indicating which compressed output buffer of data that it can operate on. The operations of the compression library 245 include performing an additional compression operation such as a "DEFLATE" operation, for example, on the compressed data obtained from the output buffer to generate final compressed data. The "DEFLATE" operation can include injecting control data, such as an EOB symbol, into the EOB of the compressed data obtained from the output buffer.

Various types of compression algorithms can be utilized in the computer system 10 such as, for example, an adaptive lossless data compression (ALDC) family of products which utilize a derivative of Lempel-Ziv encoding to compress data. As a general compression technique, the Lempel-Ziv algorithm integrates well into systems required to handle many different data types. This algorithm processes a sequence of bytes by keeping a recent history of the bytes processed and pointing to matching sequences within the history. Compression is achieved by replacing matching byte sequences with a copy pointer and length code that together are smaller in size than the replaced byte sequence.

The compression algorithm can also include the "DEFLATE" compression format, which uses a combination of the LZ77 algorithm (which removes repetitions from the data) and Huffman coding. The Huffman encoding is entropy encoding that is based on a "Huffman tree". In order to Huffman encode and decode data, a system must know in advance that the Huffman tree is being used. In order to accommodate decompression (e.g., an "Inflate" operation), the Huffman tree is written at the header of every compressed block. In one embodiment, two options are provided for Huffman trees in the Deflate standard. One option is a "static" tree, which is a single hard-coded Huffman tree, known to all compressors and decompressors. The advantage of using this static tree is that its description does not have to be written in the header of a compressed block, and is ready for immediate decompression. On the other hand, "dynamic" trees are tailored for the data block at hand and an exact description of the dynamic tree must, therefore, be written to the output.

Huffman encoding may also use a variable-length code table based on entropy to encode source symbols, and as previously mentioned, is defined either as either static or dynamic. In static Huffman coding, each literal or distance is encoded using a fixed table (SHT) that is defined in the RFC. In dynamic Huffman coding, however, special coding tables (DHT) are constructed to better suit the statistics of the data being compressed. In most cases, using DHT achieves better compression ratio (e.g., quality) when compared to SHT, at the expense of degrading the compression rate (e.g., performance) and adding design complexity. The static and dynamic Huffman encoding methods best reflect the built-in tradeoff between compression rate and ratio. The static Huffman method may achieve a lower compression ratio than is possible. This is due to using a fixed encoding table regardless of the content of the input data block. For example, random data and a four-letter DNA sequence would be encoded using the same Huffman table.

The compression library 245 can be implemented in the application 240 as a software library used for deflation/inflation and can be an abstraction of a compression algorithm. The compression library 245 obtains this compressed data, and further performs a "DEFLATE" operation on the compressed data to generate a final compressed data. The "DEFLATE" operation includes injecting control data, such as an EOB symbol, into the EOB.

In at least one embodiment, the compression library 245 allows the application 240 to break up input data to be deflated/inflated in arbitrary ways across multiple requests and provides arbitrary sized output buffers to hold the results of the deflate/inflate operation. Since the zlib compression algorithm, for example, employs the Lempel-Ziv77 type compression followed by a layer of a Huffman encoding, it achieves an increased compression ratio when the techniques are performed effectively. Even more so, the output adheres to a well-accepted standard (e.g., the DEFLATE compression format). As such, it is supported by a wide variety of web browsers and applications. Several different versions of the compression library 245 can exist and can be included with a given application 240. The compression library 245 can also allow for either the off-the-shelf software compression or decompression, along with providing a second path that can optionally communicate with the OS 215 to perform compression and/or decompression.

To initiate data compression, the application 240 outputs one or more requests to compress targeted data or a targeted data stream. The compression library 245 then behaves in a manner that is compatible with the current version of the compression accelerator 210. The version of the compression accelerator 210 can not only set the encoding scheme installed in the compression accelerator 210 but can also implement the encoding algorithm in a way that gives the hardware different performance or changes the requirement for the request block size 280 generated by the compression library 245. The adjustable behavior characteristics of the compression library 245 include, but are not limited to, adjusting a size of the request block 280 so that it is compatible with a current version of the compression accelerator 210, changing the compression size thresholds that control whether the compression accelerator performs hardware compression or refrains from performing hardware compression, and requesting different encoding schemes to be performed by the compression accelerator. In one or more embodiments, behavior of the compression library 245 can dynamically change based on the version of the compression accelerator 210. That is, one or more of the aforementioned behavior characteristics can be adjusted or changed based on the version of the version of the compression accelerator currently installed in the computer system.

The request block 280 is delivered to the compression interface 230 of the OS 215. On each request, the application 240 can supply an input buffer 250 with the data to be processed and an output buffer 260 where the processed data results are stored. On the first request of a stream, the device driver 220 of the OS 215 receives a data control block from compression library 245 which includes a stream state 270 for the data stream and may exist for the life of the data stream according to an embodiment. For each request, the device driver 220 can generate a request block 280, which can include references to the stream state 270 and the application's input buffer 250 and output buffer 260. According to a non-limiting embodiment, the compression accelerator 210 is able to access the input buffer 250 and/or output buffer 260. Thus, the compression accelerator 210 can compress the data in the input buffer 250 if compression thresholds included in the request block 280 indicate that hardware compression is necessary. The resulting data compressed by the compression accelerator can then be added to the output buffer 260 and further accessed by the compression library 245 and/or application 240.

To begin processing the compression request, the compression accelerator 210 reads the request block 280, and processes the data in the input buffer 250 to generate compressed or and/or decompressed data using an installed compression algorithm. As described herein, various compression algorithms can be employed including, but not limited to, the DEFLATE compression algorithm and ALDC algorithms. The resulting compressed data can be saved in the output buffer 260. According to a non-limiting embodiment, the compression accelerator 210 can also save an updated stream state 270 when directed by the device driver 220.

The behavior of the compression library 245 (e.g., the execution of the compression algorithm) is adjusted according to compression library control data stored in the compression library control storage unit 235. In one or more embodiments, the compression library control storage unit 235 includes library control memory fields (not shown in FIG. 2) allocated for access by the compression library 245. These library control memory fields are filled with compression library control data that corresponds to the current version of accelerator compressor 210, and in turn, controls the behavior of the compression library 245. For instance, the library control memory fields may be filled with first compression library control data corresponding to a legacy or non-updated compression accelerator 210. The compression library 245 accesses the library control memory fields and obtains the compression library control data, which causes the compression library 245 to behave in a first manner. For example, the compression library 245 may generate a request block 280 having a size of 40 kilobytes (KB) necessary to facilitate compatibility with the compression accelerator 210.

When the compression accelerator 210 is updated, however, the library control memory fields are filled with different compression library control data, which can change the behavior of the compression library 245. Accordingly, the compression library 245 accesses the library control memory fields and obtains the compression library control data corresponding to the updated compression accelerator 210. Accordingly, the behavior of the compression library 245 is forced to change so that it can still execute its compression algorithm while taking into account the updated version of the compression accelerator 210. For example, instead of generating a request block 280 having a size of 40 KB, the compression library generates a request block 280 having a size, for example, of 50 KB or 30 KB, to maintain compatibility with the new or updated compression accelerator 210.

Figure 3:
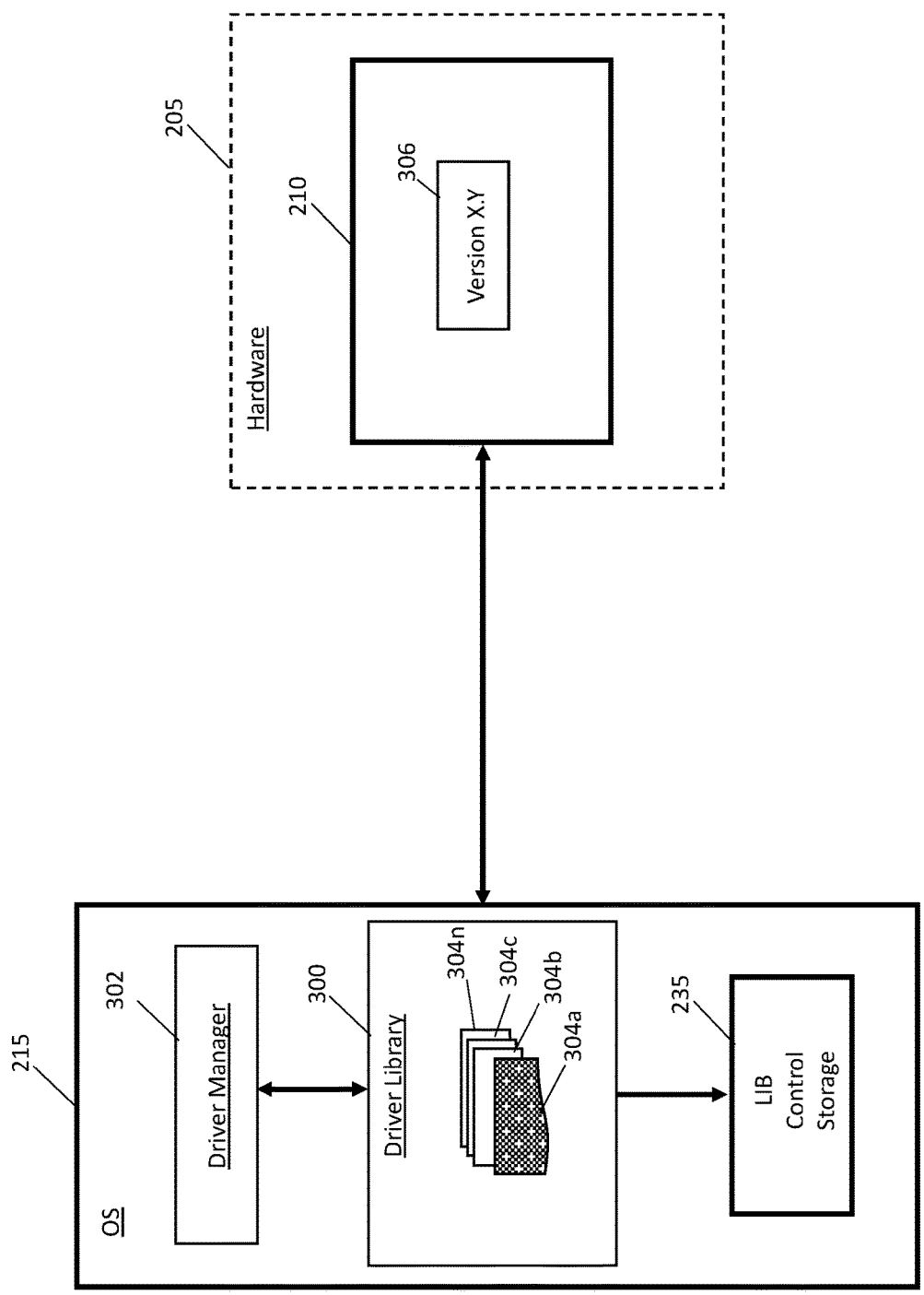
FIG. 3 is a block diagram illustrating a communication exchange between an OS and a compression accelerator included in the computer system according to a non-limiting embodiment.

With reference to FIG. 3, a block diagram illustrates communication between the OS 215 and the compression accelerator 210 according to a non-limiting embodiment. The OS 215 includes a device driver library 300 and a driver manager 302. The device driver library 300 is preloaded with several different types or versions of device libraries 304a, 304b, 304c, 304n. Each device driver 304a, 304b, 304c, 304n is associated with a particular type of compression accelerator 210 or version of the compression accelerator 210. For instance, a first device driver 304a may be associated with a legacy compression accelerator (i.e., the original compression accelerator installed on the computer system) or a currently outdated device driver, while a second device driver 304b is associated with an updated compression accelerator or a new version of the compression accelerator currently released to the market.

The driver manager 302 can be controlled by a processor (not shown in FIG. 3), and is configured to select the appropriate driver 304a, 304b, 304c, 304n that corresponds to the current version of the compression accelerator 210. In at least one non-limiting embodiment, the OS 215 initiates communication with the compression accelerator 210 upon system initialization (e.g., startup of the computer system). The communication includes requesting the compression accelerator 210 to provide information indicating its current version. In response to the request, the compression accelerator 210 reads the data indicating the current version from hardware storage 306, and returns a status signal indicating the current version of the compression accelerator 210.

The OS 215 informs the driver manager 302 of the current version of the compression accelerator 210. In turn, the driver manager accesses the driver library 300 and selects the appropriate driver (e.g., driver 304a) which corresponds to the current version of the compression accelerator 210. The selected driver 304a is initialized, and then instructs the OS 215 to fill in the compression library control memory fields (i.e., the memory fields in the compression library control storage unit 235 allocated to the compression library) with compression library control data corresponding to the current version of the compression accelerator 210. The compression library control data includes, but is not limited to, a size of the data communication block, different thresholds controlling when the compression accelerator may or may not be used, etc.

Figure 4:
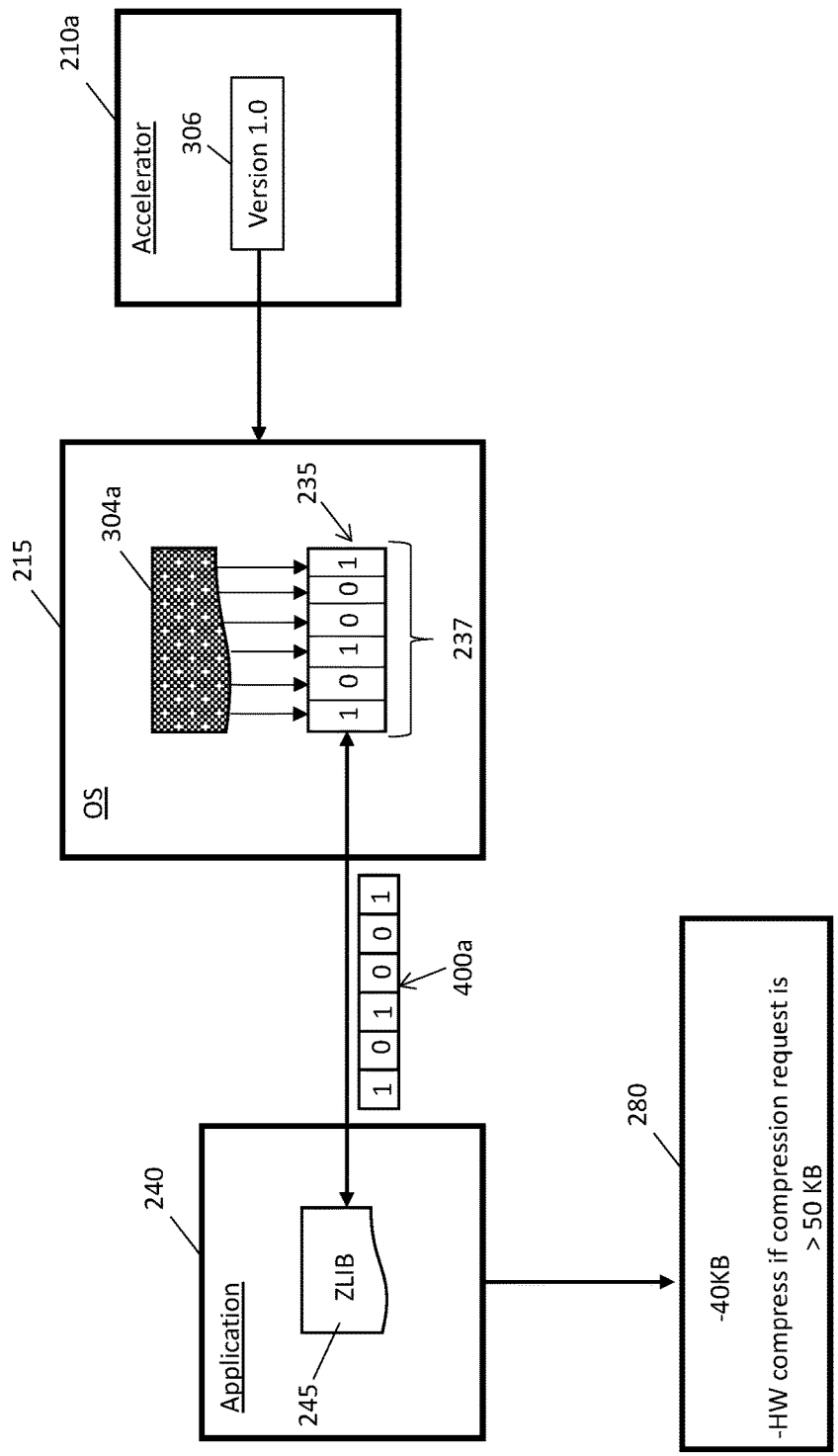
FIG. 4 illustrates a communication exchange between a static compression library and the OS following initialization of a first device driver associated with a non-updated compression accelerator according to a non-limiting embodiment.
Figure 5:
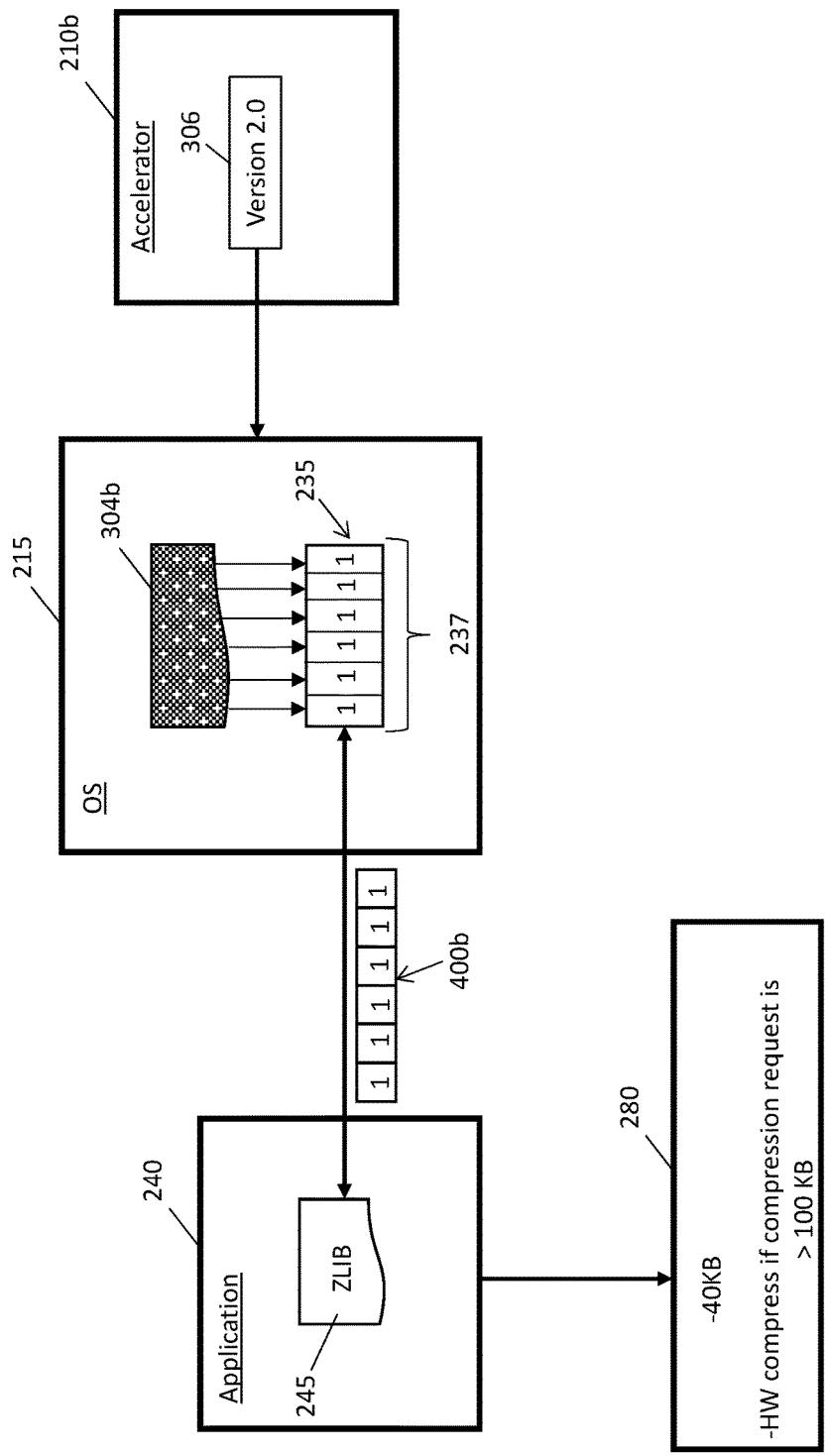
FIG. 5 illustrates a communication exchange between a static compression library and the OS following initialization of a second device driver associated with an updated compression accelerator according to a non-limiting embodiment.

Turning now to FIGS. 4 and 5, a communication exchange between the application 240 and the OS 215 is illustrated according to a non-limiting embodiment. FIG. 4 illustrates the state of the compression library control storage unit 235 following initialization of the computer system. As described herein, a first device driver 304a has been initialized after the OS 215 determined that the hardware employs a legacy or outdated version (e.g., version 1.0) of the accelerator compressor 210a. Accordingly, the first device driver 304a fills the library control memory fields 237 with compression library control data corresponding to the version 1.0 of the accelerator compressor 210a. The compression library 245 accesses the library control memory fields 237 and obtains the compression library control data 400a, which drives its behavior or compression operability.

FIG. 5, however, illustrates the OS 215 after determining that the hardware employs an updated version (e.g., version 2.0) of the accelerator compressor 210b. As a result, the OS 215 initializes a second device driver 304b, which in turn fills the library control memory fields 237 with different compression library control data corresponding to the updated version 2.0 of the accelerator compressor 210b. In at least one embodiment, the library control memory fields 237 can be updated and the data previously existing therein can be replaced with updated compression library control data that corresponds to the updated accelerator compressor 210b.

Still referring to FIG. 5, the compression library 245 accesses the library control memory fields 237 of the compression library control storage unit 235. In this scenario, however, the compression library 245 obtains different compression library control data 400b that drives its behavior or compression operability in a different manner than when operating according to the outdated compression accelerator 210a. In this manner, the static compression library 245 remains actively compatible with the hardware to perform the proper compression operations linked to the current application 240 despite a change or update in the compression accelerator 210.

Figure 6:
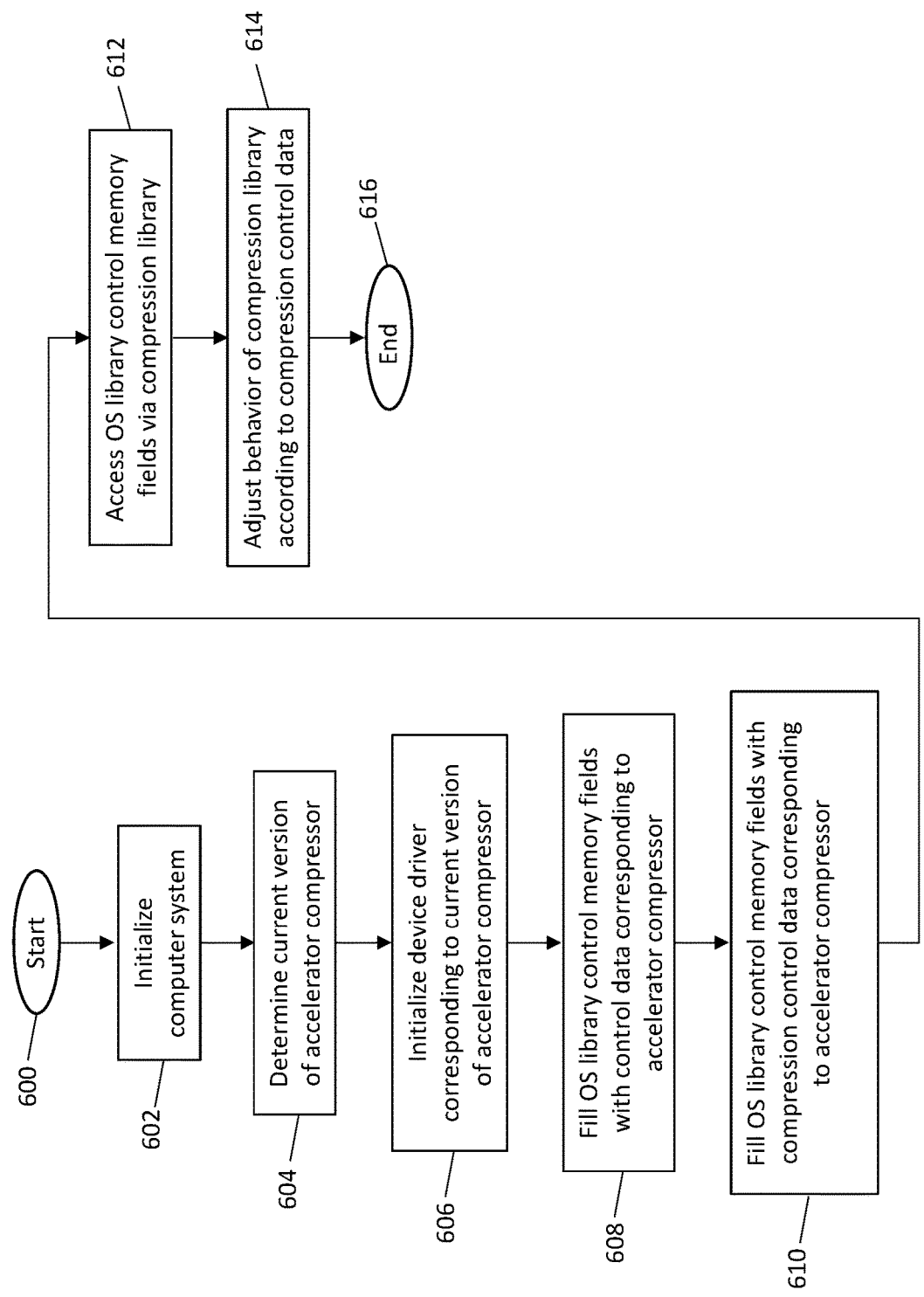
FIG. 6 is a flow diagram illustrating a method of controlling a static compression library based on a version of the compression accelerator according to a non-limiting embodiment.

With reference now to FIG. 6, a method of controlling a static compression library based on a version of the compression accelerator is illustrated according to a non-limiting embodiment. The method begins at operation 600, and at operation 602 the computer system is initialized (e.g., booted up or started). At operation 604, the current version of the accelerator compressor is determined. At operation 606, the OS selects the proper device driver corresponding to the current version of the compression accelerator, and the selected device driver is initialized at operation 608. At operation 610, the selected device driver fills the library control memory fields (included in the compression library control storage unit) with compression library control data corresponding to the current version of the compression accelerator. At operation 612, the compression library accesses the compression library control storage unit and obtains the compression library control data included in the library control memory fields. At operation 614, the compression library operates according to the compression control data obtained from the compression library control storage unit, and the method ends at operation 616.

As described herein, various non-limiting embodiments provide a computer system that initiates different device drivers based on the current version of the hardware (e.g., the hardware accelerator). One or more embodiments also provide an initialization procedure, which loads compression library control data fields of the OS memory with different control data depending on the current version of the compression accelerator. When the computer system is initialized, the control data and constants stored in the compression memory control memory fields are also updated to correctly identify the values required to operate with a new or updated compression accelerator. The compression library accesses the memory fields in the OS which store the data control data, and the behavior and operability of the compression library is driven accordingly. In this manner, the static compression library can remain actively compatible with the hardware to perform the proper compression operations linked to the current application despite a change or update in the compression accelerator.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instruction by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A computer system comprising:
a hardware controller including an accelerator configured to encode a data stream requested by an application based on a version of the accelerator;
a host system configured to execute a compression library linked to the application, the compression library operable according to at least one behavior characteristic to execute a compression algorithm that compresses the encoded data provided by the hardware controller,
a device driver library configured to store a plurality of different device drivers, each device driver among the plurality of device drivers configured to generate different compression library control data that corresponds to a given version of the hardware controller; and
a device driver manager configured to install a first device driver among the plurality of different device drivers based on the current version of the hardware controller
wherein the at least one behavior characteristic of the compression library is actively changed based on the version of the accelerator,
wherein the host system further comprises an operating system (OS) including a compression library control storage unit including library control memory fields that store first compression library control data corresponding to a first version of the accelerator, and wherein the compression library accesses the library control memory fields of the compression library control storage unit to obtain the first compression library control data, and wherein the device driver manager installs a different second device driver in response to detecting installation of a different second version of the accelerator, and wherein the second device driver replaces the first compression library control data stored in the library control memory fields with different second compression library control data that changes the at least one behavior characteristic of the compression library.

2. The computer system of claim 1, wherein the at least one behavior characteristic of the compression library comprises at least one of a size of a request block that is delivered to the hardware controller, a compression size threshold that controls execution timing of the hardware controller, and an encoding scheme to be utilized by the hardware controller based on a current version of the encoding scheme.

3. The computer system of claim 2, the OS is configured to determine the current version of the hardware controller and to generate compression library control data that changes the at least one behavior characteristic of the compression library, wherein the compression library obtains the compression library control data from the OS, and changes the at least one behavior characteristic based on the compression library control data.

4. A method of controlling a computer system, the method comprising:

encoding, via an accelerator installed in a hardware controller, a data stream requested by an application based on a version of the accelerator;

executing, via a host system, a compression library linked to the application;

storing compression library control data in library control memory fields of a compression library control storage unit installed on the host system;

operating the compression library according to at least one behavior characteristic to execute a compression algorithm that compresses the encoded data stream provided by the hardware controller;

detecting a change in the version of the accelerator; and determining, via an operating system (OS) running on the host system, the changed version of the accelerator;

generating, via the OS, updated compression library control data that changes the at least one behavior characteristic of the compression library based on the changed version of the accelerator;

replacing the compression library control data stored in the library control memory fields with the updated compression library control data;

obtaining, via the compression library, the updated compression library control data from the library control memory fields; and changing the at least one behavior characteristic of the compression library based on the updated compression library control data.

5. The method of claim 4, wherein changing the at least one behavior characteristic of the compression library comprises at least one of adjusting a request block that is delivered to the hardware controller to a size that is compatible with the current version of an encoding scheme, changing a compression size threshold that controls execution timing of the hardware controller, and requesting different encoding schemes to be performed by the hardware controller based on the current version of the current version of the encoding scheme.

6. The method of claim 5, wherein generating the updated compression library control data comprises:

storing, via a device driver library, a plurality of different device drivers; and installing, via a device driver manager, a first device driver among the plurality of different device drivers based on a current version of the accelerator.

7. The method of claim 6, wherein each device driver among the plurality of device drivers is configured to generate different compression library control data that corresponds to a given version of the hardware controller.

8. The method of claim 7, wherein generating the updated compression library control data further comprises:

storing, via a compression library control storage unit, first compression library control data corresponding to a first version of the hardware controller; and accessing, via the compression library, the compression library control storage unit to obtain the first compression library control data.

9. The method of claim 8, wherein generating the updated compression library control data further comprises:

installing, via the device driver manager, a different second device driver in response to detecting installation of a different second version of the accelerator; and replacing, via the second device driver, the first compression library control data with different second compression library control data that changes the at least one behavior characteristic of the compression library.

10. A computer program product to control computer system to compress data, the computer program product comprising a computer readable storage medium having program instructions embodied therewith, the program instructions executable by an electronic computer processor to control the computer system to perform operations comprising:

encoding, via an accelerator installed in a hardware controller, a data stream requested by an application based on a version of the accelerator;

executing, via a host system, a compression library linked to the application; storing compression library control data in library control memory fields of a compression library control storage unit installed on the host system;

operating the compression library according to at least one behavior characteristic to execute a compression algorithm that compresses the encoded data provided by the hardware controller;

detecting a change in the version of the accelerator;

determining, via an operating system (OS) running on the host system, the changed version of the accelerator;

generating, via the OS, updated compression library control data that changes the at least one behavior characteristic of the compression library based on the changed version of the accelerator;

replacing the compression library control data stored in the library control memory fields with the updated compression library control data;

obtaining, via the compression library, the updated compression library control data from the library control memory fields; and changing the at least one behavior characteristic of the compression library based on the updated compression library control data.

11. The computer program product of claim 10, wherein changing the at least one behavior characteristic of the compression library comprises at least one of adjusting a request block that is delivered to the hardware controller to a size that is compatible with a current version of an encoding scheme, changing a compression size threshold that controls execution timing of the hardware controller, and requesting different encoding schemes to be performed by the hardware controller based on the current version of the current version of the encoding scheme.

12. The computer program product of claim 10, wherein generating the updated compression library control data comprises:

storing, via a device driver library, a plurality of different device drivers; and installing, via a device driver manager, a first device driver among the plurality of different device drivers based on a current version of the accelerator, wherein each device driver among the plurality of device drivers is configured to generate different compression library control data that corresponds to a given version of the hardware controller.

13. The computer program product of claim 12, wherein generating the updated compression library control data further comprises:

storing, via a compression library control storage unit, first compression library control data corresponding to a first version of the hardware controller; and accessing, via the compression library, the compression library control storage unit to obtain the first compression library control data.

14. The computer program product of claim 13, wherein generating the updated compression library control data further comprises:

installing, via the device driver manager, a different second device driver in response to detecting installation of a different second version of the accelerator; and replacing, via the second device driver, the first compression library control data with different second compression library control data that changes the at least one behavior characteristic of the compression library.

* * * * *